United States Patent
Elfström et al.

(10) Patent No.: US 11,659,498 B2
(45) Date of Patent: May 23, 2023

(54) EQUIVALENT ISOTROPICALLY RADIATED POWER (EIRP) MANUFACTURER DECLARATION CONCEPT FOR BASE STATION

(71) Applicant: Telefonaktiebolaget LM Ericsson (publ), Stockholm (SE)

(72) Inventors: Torbjörn Elfström, Fjärås (SE); Farshid Ghasemzadeh, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 79 days.

(21) Appl. No.: 17/289,158

(22) PCT Filed: Oct. 24, 2019

(86) PCT No.: PCT/SE2019/051047
§ 371 (c)(1),
(2) Date: Apr. 27, 2021

(87) PCT Pub. No.: WO2020/091654
PCT Pub. Date: May 7, 2020

(65) Prior Publication Data
US 2021/0385762 A1    Dec. 9, 2021

Related U.S. Application Data

(60) Provisional application No. 62/754,999, filed on Nov. 2, 2018.

(51) Int. Cl.
*H04W 52/36* (2009.01)
*H04B 17/10* (2015.01)

(52) U.S. Cl.
CPC ........ *H04W 52/367* (2013.01); *H04B 17/102* (2015.01)

(58) Field of Classification Search
CPC .. H04W 52/367; H04W 52/36; H04B 17/102; H04B 17/10
See application file for complete search history.

(56) References Cited

U.S. PATENT DOCUMENTS 7,949,344 B1 * 5/2011 Mulcay ................ H04W 16/14
455/426.2
2021/0143893 A1 * 5/2021 Taneja .................. H04W 60/00

OTHER PUBLICATIONS

3GPP TSG-RAN WG4, R4-1813175, Meeting #88bis, Chengdu, China, Oct. 8-12, 2018, "Change Request" NEC, Sep. 28, 2018; whole document; pp. 6: "Reasons for Change". (Year: 2018).*

(Continued)

*Primary Examiner* — John J Lee
(74) *Attorney, Agent, or Firm* — Rothwell, Figg, Ernst & Manbeck, P.C.

(57) ABSTRACT

A method of declaring Equivalent Isotropically Radiated Power (EIRP) for an operating frequency band of a base station. The method includes: declaring a first EIRP for a first frequency of the operating frequency band, declaring a second EIRP for a second frequency of the operating frequency band, and declaring a third EIRP for a third frequency of the operating frequency band, wherein the third frequency is between the first frequency and the second frequency, and wherein the second frequency is higher than the first frequency.

7 Claims, 8 Drawing Sheets

(56) References Cited

OTHER PUBLICATIONS

3GPP TSG-RAN WG4, R4-1813176, Meeting #88bis, Chengdu, China, Oct. 8-12, 2018, "TP to TS38.141-2; Radiated transmit power requirement with wideband operation (6.2)" NEC, Sep. 28, 2018; whole document; Sections 6.2.1 and 6.2.4.2. (Year: 2018).*
International Search Report and Written Opinion issued in International Application No. PCT/SE2019/051047 dated Feb. 5, 2020 (16 pages).
NEC, "Draft CR for TS 38.104: Radiated transmit power requirement with wideband operation (9.2)", 3GPP TSG-RAN4 Meeting #88bis, R4-1813175, Chengdu, China, Oct. 8-12, 2018 (7 pages).
Ericsson, "EIRP characteristics for wide NR bands", TSG-RAN Working Group 4 (Radio) meeting #86bis, R4-1805799, Melbourne, Australia, Apr. 16-20, 2018 (3 pages).
NEC, "TP to TS38.141-2: Radiated transmit power requirement with wideband operation (6.2)", 3GPP TSG-RAN WG4 Meeting #88bis, R4-1813176, Chengdu, China, Oct. 8-12, 2018 (16 pages).
Ericsson, On improvements of EIRP declarations for wide operating bands, TSG-RAN Working Group 4 (Radio) meeting #89, R4-1815320, Nov. 12-16, 2018 (6 pages).
ETSI TS 138.104 v15.3.0, Oct. 2018 (160 pages).
3GPP TS 38.141-2 v1.0.0, Sep. 2018 (179 pages).
Ericsson, "On improved declarations for EIRP characteristics for wide NR bands", TSG-RAN Working Group 4 (Radio) meeting #87, R4-1806907, Busan, Korea, May 21-25, 2018 (6 pages).
NEC, "Draft CR for TS 38.104: EIRP declarations for wide NR bands (9.2)", 3GPP TSG-RAN4 Meeting #88, R4-1811201, Gothenburg, Sweden Aug. 20-24, 2018 (2 pages).

\* cited by examiner

100

| BS Type | $\Delta_{normal}$ (dB) | $\Delta_{extreme}$ (dB) |
|---|---|---|
| 1-H, 1-O | +/- 2.2 | +/- 2.7 |
| 2-O | +/- 3.4 | +/- 4.5 |
| NOTE: The extreme condition EIRP requirement is not applicable for 1-H | | |

FIG. 1

| Band | Band Definition $f_L$ to $f_H$ (MHz) | Absolute Bandwidth $f_H - f_L$ (MHz) | Relative Bandwidth $f_L/f_c$ (dB) | Fractional Bandwidth $100(f_H-f_L)/f_c$ (%) |
|---|---|---|---|---|
| 44 | 703 to 803 | 100 | 0.6 | 13.3 |
| 39 | 1880 to 1920 | 40 | 0.1 | 2.1 |
| 40 | 2300 to 2400 | 100 | 0.2 | 4.3 |
| 38 | 2570 to 2620 | 50 | 0.08 | 1.9 |
| 41, n41 | 2496 to 2690 | 194 | 0.3 | 7.5 |
| 42 | 3400 to 3600 | 200 | 0.2 | 5.7 |
| 43 | 3600 to 3800 | 200 | 0.2 | 5.4 |
| n77 | 3300 to 4200 | 900 | 1.0 | 24.0 |
| n78 | 3300 to 3800 | 500 | 0.6 | 14.1 |
| 48 | 3550 to 3700 | 150 | 0.2 | 4.1 |
| n79 | 4400 to 5000 | 600 | 0.6 | 12.8 |
| 46 | 5150 to 5925 | 775 | 0.6 | 14.0 |
| n257 | 26500 to 29500 | 3000 | 0.5 | 10.7 |
| n258 | 24250 to 27500 | 3250 | 0.5 | 12.6 |
| n260 | 37000 to 40000 | 2500 | 0.3 | 6.5 |
| n261 | 27500 to 28350 | 850 | 0.13 | 3.0 |

200

300

| Band | δ (dB) |
|------|--------|
| n41  | -0.6   |
| n77  | -2.1   |
| n78  | -1.2   |
| n79  | -1.1   |
| n257 | -0.9   |
| n258 | -1.1   |
| n260 | -0.7   |

FIG. 3

EQUIVALENT ISOTROPICALLY RADIATED POWER (EIRP) MANUFACTURER DECLARATION CONCEPT FOR BASE STATION

CROSS REFERENCE TO RELATED APPLICATION(S)

This application is a 35 U.S.C. § 371 National Stage of International Patent Application No. PCT/SE2019/051047, filed Oct. 24, 2019, designating the United States, which claims priority to U.S. provisional patent application no. 62/754,999, filed on Nov. 2, 2018. The above identified applications are incorporated by this reference.

TECHNICAL FIELD

Disclosed are embodiments related to EIRP declarations.

BACKGROUND

The technical background for having multiple EIRP declarations as part of a radiated transmit requirement is currently being discussed extensively.

Conventionally, a declarant declares a first EIRP for a lowest supported frequency and a second EIRP for a highest supported frequency of a frequency operating band considering fractional bandwidth (FBW) due to variation in antenna directivity over frequency.

SUMMARY

The current agreed specification text in TS 38.104 has some issues with respect to carrier aggregation (CA) support and conformance testing. Based on an analysis of typical EIRP characteristics associated to an array antenna and considering conformance test aspects, a proposal for extending the declaration for radiated transmit power requirement is disclosed herein.

In this current disclosure some new aspects to EIRP declaration are provided. For the single carrier case it had been previously decided that it is sufficient to have EIRP declared for lowest and highest supported frequency, while for CA cases further consideration is needed. However, it is not clear how the mid frequency should be described in the RF core specification to be compatible with the conformance test specification.

Certain embodiments disclosed herein provide improved EIRP declaration.

For instance, in one aspect, there is provided a method of declaring EIRP for an operating frequency band of a base station. The method includes declaring a first EIRP for a first frequency of the operating frequency band. The method includes declaring a second EIRP for a second frequency of the operating frequency band. The method includes declaring a third EIRP for a third frequency of the operating frequency band, wherein the third frequency is between the first frequency and the second frequency, and wherein the second frequency is higher than the first frequency.

In some embodiments, the method includes declaring that, for a first frequency range between the first frequency and the third frequency, EIRP is higher than the first EIRP and lower than the third EIRP. In some embodiments, the method includes declaring that, for a second frequency range between the third frequency and the second frequency, EIRP is higher than the third EIRP and lower than the second EIRP.

In some embodiments, a fractional bandwidth value associated with the operating frequency band is larger than a threshold based on the width of supported frequency bands. In some embodiments, the threshold is further based on an EIRP accuracy window. In some embodiments, the threshold is 6%.

In some embodiments, the first frequency is a lowest supported frequency of the operating frequency band, the second frequency is a highest supported frequency of the operating frequency band, and the third frequency is a middle frequency of the operating frequency band.

In some embodiments, the method includes declaring one or more additional EIRPs for one or more additional frequencies of the operating frequency band, wherein the one or more additional frequencies are between the first frequency and the second frequency.

In another instance, there is provided a method of determining EIRP for an operating frequency band of a base station. The method includes determining a first EIRP for a first frequency of the operating frequency band. The method includes determining a second EIRP for a second frequency of the operating frequency band. The method includes determining a third EIRP for a third frequency of the operating frequency band, wherein the third frequency is between the first frequency and the second frequency, and the second frequency is higher than the first frequency.

In some embodiments, the method includes declaring that, for a first frequency range between the first frequency and the third frequency, EIRP is higher than the first EIRP and lower than the third EIRP; and declaring that, for a second frequency range between the third frequency and the second frequency, EIRP is higher than the third EIRP and lower than the second EIRP.

In some embodiments, the method includes obtaining a fractional bandwidth value associated with the operating frequency band; and determining whether the obtained fractional bandwidth value is larger than a threshold based on the width of supported frequency bands. In some embodiments, the threshold is 6%.

In some embodiments, determining the first EIRP, second EIRP, and third EIRP comprises calculating an equation given by:

$$EIRP = TRP + D,$$

where TRP represents total radiated power of the base station in dBm, and D represents directivity of the base station in dBi.

In some embodiments, $D = D_E + 10 \log(N)$, where $$D_E = 10\log\left(\frac{4\pi A_{\mathit{eff}}}{\lambda^2}\right),$$

where $A_{\mathit{eff}}$ represents antenna aperture in squared meters and $\lambda$ represents wavelength in meters.

In some embodiments, the first frequency is a lowest supported frequency of the operating frequency band, the second frequency is a highest supported frequency of the operating frequency band, and the third frequency is a middle frequency of the operating frequency band.

In some embodiments, the method includes determining one or more additional EIRPs for one or more additional frequencies of the operating frequency band, wherein the one or more additional frequencies are between the first frequency and the second frequency.

In another aspect, there is provided a method of testing a device. The method includes obtaining the device. The method includes obtaining declared values associated with the device. The method includes testing the device to determine whether the device is compliant with the obtained declared values.

In some embodiments, the device operates in an operating frequency band. In some embodiments, the declared values comprise a first EIRP for a first frequency of the operating frequency band, a second EIRP for a second frequency of the operating frequency band, and a third EIRP for a third frequency of the operating frequency band, wherein the third frequency is between the first frequency and the second frequency, and the second frequency is higher than the first frequency.

In some embodiments, the first frequency is a lowest supported frequency of the operating frequency band, the second frequency is a highest supported frequency of the operating frequency band, and the third frequency is a middle frequency of the operating frequency band.

BRIEF DESCRIPTION OF THE DRAWINGS

The accompanying drawings, which are incorporated herein and form part of the specification, illustrate various embodiments.

FIG. 1 illustrates a table according to one embodiment.
FIG. 3 illustrates a table according to one embodiment.

DETAILED DESCRIPTION

The manufacturer declarations part of radiated transmit power requirement defined in TS 38.104, sub-clause 9.2 provides information with respect to a number of supported beams, beam directions, among others. The detailed description of manufacturer declared parameters is captured in TS 38.141-2, sub-clause 4.6.

The radiated transmit power requirement is based on a declared EIRP level for a declared beam at a specific beam peak direction. For each beam, the requirement is based on a declaration of a beam identity, reference beam direction pair, beam-width, rated beam EIRP, over the air (OTA) peak directions set, the beam direction pairs at the maximum steering directions and associated rated beam EIRP and beam-widths.

For a declared beam and beam direction pair, the rated beam EIRP level is the maximum power that the base station is declared to radiate at the associated beam peak direction during a transmitter ON period. For each beam peak direction associated with a beam direction pair within the OTA peak directions set, a specific rated beam EIRP level may be claimed. Any claimed EIRP value shall be met within the specified accuracy window per operating band.

The OTA peak directions set is a set of beam peak directions for which the EIRP accuracy requirement is intended to be met. The beam peak directions are related to a corresponding contiguous range or discrete list of beam center directions by the beam direction pairs included in the set. A beam direction pair is a data set consisting of the beam center direction and the related beam peak direction. A declared EIRP value is a value provided by the manufacturer for verification according to the conformance specification declaration requirements, whereas a claimed EIRP value is provided by the manufacturer to the equipment used for normal operation of the equipment and is not subject to formal conformance testing.

For each declared beam, for any specific beam peak direction associated with a beam direction pair within the OTA peak directions set, a manufacturer claimed EIRP level in the corresponding beam peak direction shall be achievable to within $\pm\Delta$ dB of the claimed value. FIG. 1 illustrates a table 100 showing RF core EIRP accuracy requirements. Table 100 provides the accuracy interval for different base station types and environmental conditions.

Figure 2:
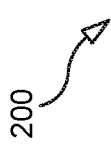
FIG. 2 illustrates a table according to one embodiment.

Since NR may support legacy band and new wider bands the impact on EIRP due to large operating bands need some further consideration. FIG. 2 illustrates a table 200 showing examples of 3GPP operating bands. In table 200, the antenna operating bandwidth is examined in terms of absolute bandwidth, relative bandwidth and fractional bandwidth for some wide Evolved Universal Terrestrial Radio Access (E-UTRA) and NR bands defined in 3GPP.

Based on the analysis of bandwidth, there is a need to consider fractional bandwidth as key parameter for wide band antennas from an antenna design point of view.

The fractional bandwidth of an antenna is a measure of how wideband the antenna is. If the antenna operates at center frequency $f_c$ between lower frequency $f_l$ and upper frequency $f_h$, then the fractional bandwidth FBW is given in percent as:

$$FBW = 100\frac{f_h - f_l}{f_c} = 200\frac{f_h - f_l}{f_h + f_l} \qquad \text{(Equation 1)}$$

In some embodiments, the fractional bandwidth varies between 0% and 200%. For traditional frequency bands the fractional bandwidth is in the range 2% to 6%, with some exceptions such as band 44.

For NR, the directivity impact on EIRP has been studied where new bands have been introduced with large bandwidths. The radiated transmit power in a specific direction in terms of EIRP may be expressed in dBm as:

$$\text{EIRP} = TRP + D \qquad \text{(Equation 2)}$$

where TRP is the total radiated power in dBm and D is the directivity in dBi. For an array antenna, where elements are arranged in a uniform rectangular lattice the peak directivity per polarization can be approximated in dBi as:

$$D = D_E + 10 \log(N) \qquad \text{(Equation 3)}$$

where N is the number of elements (relating to the array factor) and $D_E$ is the element directivity in dBi (relating to the element factor). From TR 38.803, Annex C [2], the element directivity may be expressed in dBi as:

$$D_E = 10\log\left(\frac{4\pi A_{\mathit{eff}}}{\lambda^2}\right) \qquad \text{(Equation 4)}$$

where $A_{\mathit{eff}}$ is the antenna aperture in squared meters (m²) and $\lambda$ is the wave length in meters. For a uniform rectangular array antenna, where elements as separated d $\lambda$ m along both y-axis and the z-axis, the maximum area for the antenna aperture may be limited to an area of (d $\lambda$)² m². In some embodiments, the physical area is equal to $A_{\mathit{eff}}$ for an array antenna implementation, d is in the range of 0.5λ to 0.7λ to achieve acceptable spatial selectivity, and λ is derived from the highest supported frequency.

Since the directivity depends on frequency, it is of interest to analyze the directivity characteristics as a function of very wide operating bands. For wide operating bands the antenna array needs to be designed to support a large operating bandwidth, $B=f_h-f_l$, where $f_h$ is the highest supported frequency in MHz and $f_l$ is the lowest supported frequency in MHz.

The directivity difference, δ, in dB due to large supported bandwidth may be expressed as the difference between the directivity at the lowest frequency, $D_l$ and the directivity at the highest frequency, $D_h$ as:

$$\delta = D_l - D_h = 10\log\left(\frac{\frac{4\pi d^2 \lambda^2}{\lambda_l^2}}{\frac{4\pi d^2 \lambda^2}{\lambda_h^2}}\right) = 20\log\left(\frac{f_l}{f_h}\right) \quad \text{(Equation 5)}$$

FIG. 3 shows table 300 which shows directivity variation over supported frequency range. In table 300, the directivity difference is plotted for wide NR bands with FBW>6%. The directivity is lower at lowest supported frequency compared with the highest supported frequency. Accordingly, there is a need for further considerations with respect to how the EIRP is declared for wide operating bands, e.g. wide NR bands with FBW>6%, added for NR.

For operating frequency bands where the base station supports FBW>6%, the directivity change over the operating frequency band is substantial compared to the EIRP accuracy requirements listed in table 100.

For active antenna array system (AAS) supporting NR, UTRA and E-UTRA frequency bands, the EIRP is declared per operating frequency band, which means that the transmit power accuracy requirement needs to be fulfilled within the entire frequency range of the operating frequency band. For frequency bands included in AAS, the effect of directivity drop due to frequency is neglectable. However, for some wide NR FR1 and FR2 bands, the EIRP may be declared per lowest frequency and highest frequency instead of per band.

The current version of the RF core specification (TS 38.104, sub-clause 9.2.1) describes the EIRP declaration for wide band support as: For operating bands where the supported fractional bandwidth (FBW) is larger than 6%, EIRP is declared as $EIRP_{FBWlow}$ at minimum supported frequency $F_{FBWlow}$, and as $EIRP_{FBWhigh}$ at maximum supported frequency $F_{FBWhigh}$. For frequencies in between the $F_{FBWlow}$ and $F_{FBWhigh}$ frequency the EIRP is:

$EIRP_{FBWlow}$ for the frequency range $F_{FBWlow} \leq f < (F_{FBWlow}+F_{FBWhigh})/2$, $EIRP_{FBWhigh}$ for the frequency range $(F_{FBWlow}+F_{FBWhigh})/2 \leq f \leq F_{FBWhigh}$ where parameters are described in TS 38.104, sub-clause 3 as a fractional bandwidth. The fractional bandwidth FBW is defined as:

$$FBW = 200 \cdot \frac{F_{DL\_high} - F_{DL\_low}}{F_{DL\_high} + F_{DL\_low}} \%,$$

where $EIRP_{FBWhigh}$ represents declared EIRP value for the upper supported frequency within supported operating band, for which fractional bandwidth support was declared, $EIRP_{FBWlow}$ represents declared EIRP value for the lower supported frequency within supported operating band, for which fractional bandwidth support was declared, $F_{FBWhigh}$ represents upper supported frequency within supported operating band, for which fractional bandwidth support was declared, and $F_{FBWlow}$ represents lower supported frequency within supported operating band, for which fractional bandwidth support was declared.

In the current definition of FBW, the parameters used shall not be per defined band ($F_{DL\_high}$, $F_{DL\_low}$). Instead, the supported band support for a specific band ($F_{FBWhigh}$, $F_{FBWlow}$) shall be captured.

Figure 4:
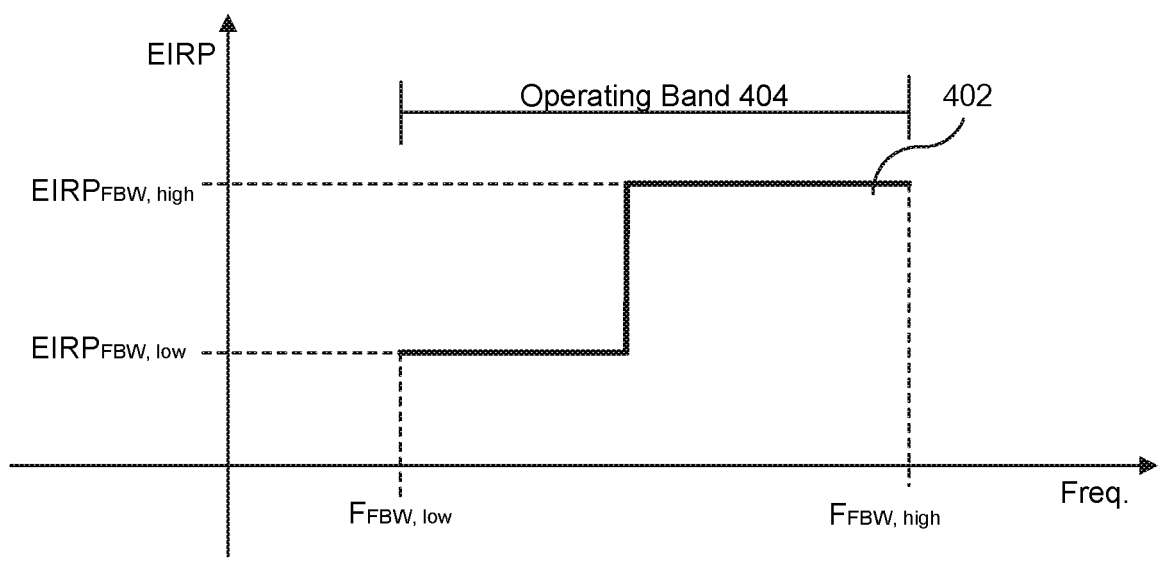
FIG. 4 illustrates EIRPs according to one embodiment.

With the current definition of FBW, a base station supporting a wide band, e.g. n257, may only have the capability to operate within sub-band of n257. Therefore, there is a need for the definition to capture that the FBW is defined by the actual supported part of the operating frequency band. In FIG. 4, the EIRP according to a conventional declaration method is plotted. The line 402 indicates the declared EIRP between declared points. As shown in FIG. 4, the EIRP according to the conventional declaration method provides a discrete step in the middle of the operating frequency band 404, which does not reflect the physical characteristics of directivity described above by Equation 5. A discrete step does not provide an accurate description of the expected EIRP characteristics associated with a NR base station.

Figure 5:
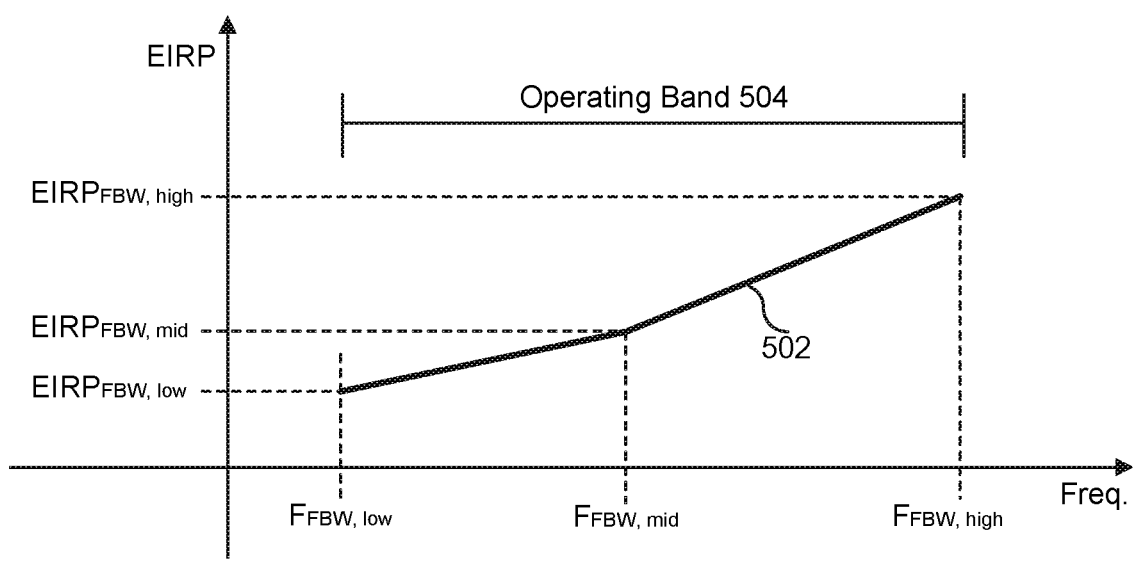
FIG. 5 illustrates EIRPs according to one embodiment.

As such, there is a need to introduce more declaration points for the EIRP part of the radiated transmit power requirement. In some embodiments, EIRP may be measured at a bottom frequency, a middle frequency and a top frequency in a single carrier case. FIG. 5 shows a line 502 indicating EIRP declared according to improved declaration methods disclosed herein. As shown in FIG. 5, the EIRP has a slope to a mid-point, e.g, $F_{FBW,mid}$, and another slope from the mid-point, according to some embodiments.

The improved declaration methods provided herein provide a reasonable compromise between complexity and technically captured expected EIRP characteristics.

In some embodiments, the introduction of a declared middle point frequency, may resolve the technical artefact with a step function as shown in FIG. 4 and resolve the misalignment between the RF core specification and the conformance test specification.

To better reflect the physical characteristics with respect to directivity for an array antenna, the EIRP may be declared with multiple points according to some embodiments. In such embodiments, the EIRP between minimum supported frequency and maximum supported frequency can then be interpolated to any shape by adding declaration points. An example with three declaration points is described below.

Figure 6:
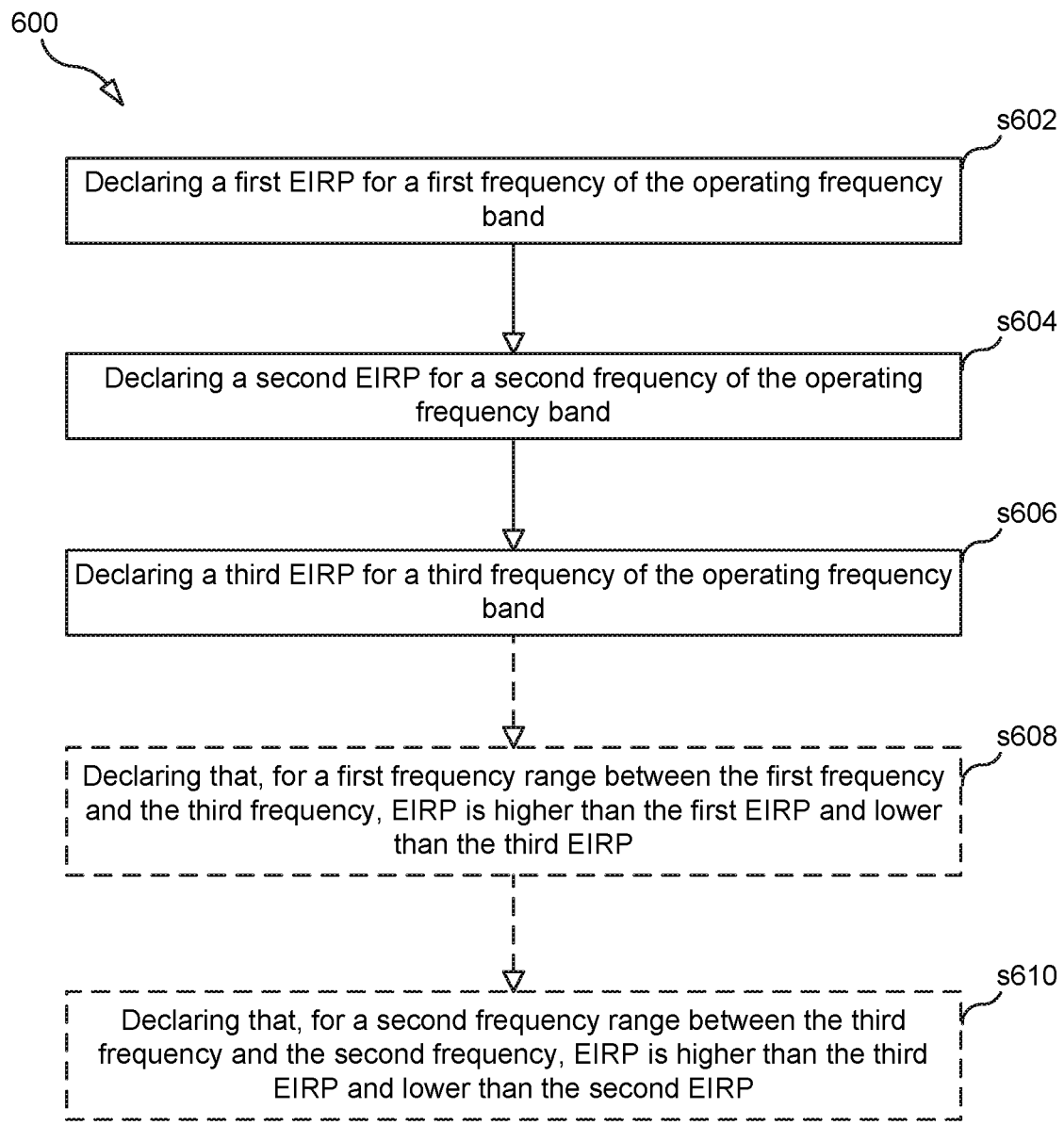
FIG. 6 is a flow chart illustrating a process according to one embodiment.

For operating bands where the supported fractional bandwidth (FBW) is larger than 6%, EIRP is declared as $EIRP_{FBWlow}$ at minimum supported frequency $F_{FBWlow}$, $EIRP_{FBWmid}$ at middle frequency $F_{FBWmid}$ and as $EIRP_{FBWhigh}$ at maximum supported frequency $F_{FBWhigh}$. For frequencies in between the $F_{FBWlow}$ and $F_{FBWhigh}$ frequency the EIRP is:

$EIRP_{FBWlow}$, <EIRP<$EIRP_{FBWmid}$ for the frequency range $F_{FBWlow}$<f<$F_{FBWmid}$, $EIRP=EIRP_{FBWmid}$ at frequency $F_{FBWmid}$ $EIRP_{FBWmid}$, <EIRP<$EIRP_{FBWhigh}$ for the frequency range $F_{FBWmid}$<f<$F_{FBWhigh}$;

FIG. 6 is a flow chart illustrating a process 600 of declaring Equivalent Isotropically Radiated Power (EIRP) for an operating frequency band of a base station. The process 600 may begin with step s602 in which a first EIRP for a first frequency of the operating frequency band is declared. In step s604, a second EIRP for a second frequency of the operating frequency band is declared. In step s606, a third EIRP for a third frequency of the operating frequency band is declared, wherein the third frequency is between the first frequency and the second frequency, and wherein the second frequency is higher than the first frequency.

In some embodiments, process 600 includes step s608 in which EIRP is declared for a first frequency range between the first frequency and the third frequency such that the EIRP is higher than the first EIRP and lower than the third EIRP. In some embodiments, process 600 includes step s610 in which EIRP is declared for a second frequency range between the third frequency and the second frequency such that the EIRP is higher than the third EIRP and lower than the second EIRP.

In some embodiments, a fractional bandwidth value associated with the operating frequency band is larger than a threshold based on the width of supported frequency bands. In some embodiments, the threshold is 6%.

In some embodiments, the first frequency is a lowest supported frequency of the operating frequency band, the second frequency is a highest supported frequency of the operating frequency band, and the third frequency is a middle frequency of the operating frequency band.

Figure 7:
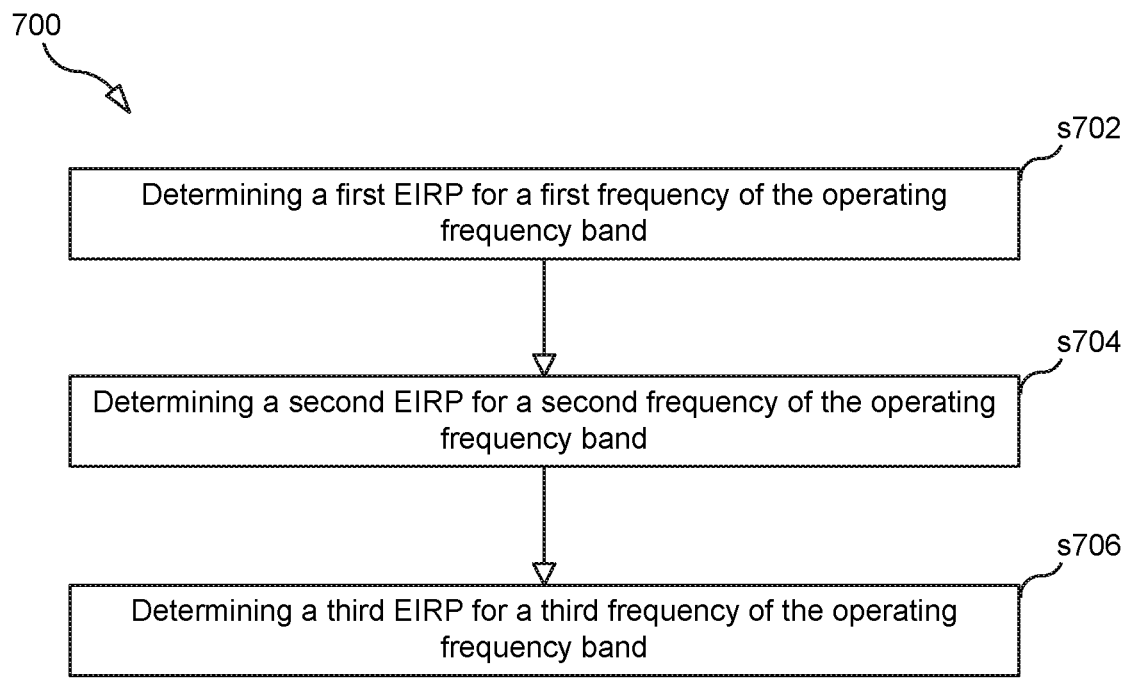
FIG. 7 is a flow chart illustrating a process according to one embodiment.

In some embodiments, process 600 includes a further step in which one or more additional EIRPs are declared for one or more additional frequencies of the operating frequency band, wherein the one or more additional frequencies are between the first frequency and the second frequency FIG. 7 is a flow chart illustrating a process 700 of determining Equivalent Isotropically Radiated Power (EIRP) for an operating frequency band of a base station. The process 700 may begin with step s702 in which a first EIRP for a first frequency of the operating frequency band is determined. In step s704, a second EIRP for a second frequency of the operating frequency band is determined. In step s706, a third EIRP for a third frequency of the operating frequency band is determined, wherein the third frequency is between the first frequency and the second frequency, and wherein the second frequency is higher than the first frequency.

In some embodiments, process 700 includes a further step in which EIRP is declared for a first frequency range between the first frequency and the third frequency such that the EIRP is higher than the first EIRP and lower than the third EIRP.

In some embodiments, process 700 includes a further step in which EIRP is declared for a second frequency range between the third frequency and the second frequency such that the EIRP is higher than the third EIRP and lower than the second EIRP.

In some embodiments, process 700 includes a further step in which a fractional bandwidth value associated with the operating frequency band is obtained. In some embodiments process 700 includes a further step where it is determined whether the obtained fractional bandwidth value is larger than a threshold based on the width of supported frequency bands. In some embodiments, the threshold is 6%.

In some embodiments, the step of determining the first EIRP, second EIRP, and third EIRP comprises calculating an equation given by: EIRP=TRP+D, where TRP represents total radiated power of the base station in dBm, and D represents directivity of the base station in dBi.

In some embodiments, $D=D_E+10 \log(N)$, where $$D_E = 10\log\left(\frac{4\pi A_{\mathit{eff}}}{\lambda^2}\right),$$

where $A_{\mathit{eff}}$ represents antenna aperture in squared meters and $\lambda$ represents wavelength in meters.

In some embodiments, the first frequency is a lowest supported frequency of the operating frequency band, the second frequency is a highest supported frequency of the operating frequency band, and the third frequency is a middle frequency of the operating frequency band.

In some embodiments, process 700 includes a further step in which one or more additional EIRPs are determined for one or more additional frequencies of the operating frequency band, wherein the one or more additional frequencies are between the first frequency and the second frequency.

Figure 8:
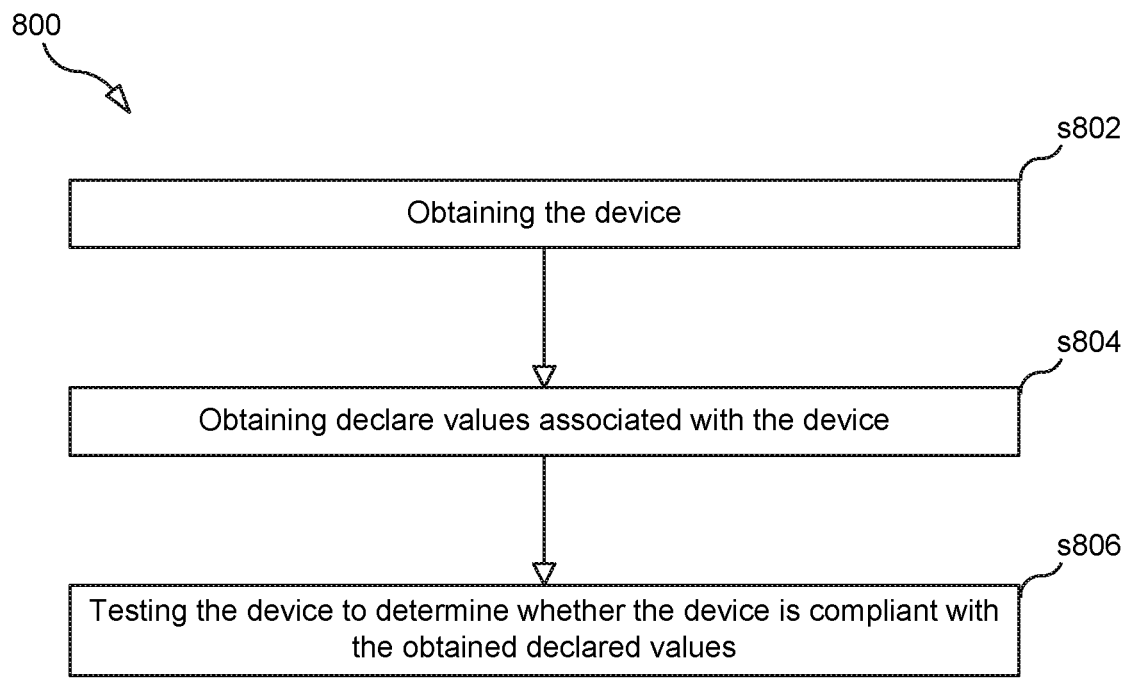
FIG. 8 is a flow chart illustrating a process according to one embodiment.

FIG. 8 is a flow chart illustrating a process 800 of testing a device. The process 800 may begin with step s802 in which a device is obtained. In step s804, declared values associated with the device are obtained. In step s806, the device is tested to determine whether the device is compliant with the obtained declared values.

In some embodiments, the device operates in an operating frequency band. In some embodiments, the declared values comprise a first Equivalent Isotropically Radiated Power (EIRP) for a first frequency of the operating frequency band, a second EIRP for a second frequency of the operating frequency band, and a third EIRP for a third frequency of the operating frequency band, wherein the third frequency is between the first frequency and the second frequency, and the second frequency is higher than the first frequency.

In some embodiments, the first frequency is a lowest supported frequency of the operating frequency band, the second frequency is a highest supported frequency of the operating frequency band, and the third frequency is a middle frequency of the operating frequency band.

Summary of various embodiment:

A1. A method of declaring Equivalent Isotropically Radiated Power (EIRP) for an operating frequency band of a base station, the method comprising: declaring a first EIRP for a first frequency of the operating frequency band; declaring a second EIRP for a second frequency of the operating frequency band; and declaring a third EIRP for a third frequency of the operating frequency band, wherein the third frequency is between the first frequency and the second frequency, and wherein the second frequency is higher than the first frequency.

A2. The method of embodiment A1, further comprising: declaring that, for a first frequency range between the first frequency and the third frequency, EIRP is higher than the first EIRP and lower than the third EIRP; and declaring that, for a second frequency range between the third frequency and the second frequency, EIRP is higher than the third EIRP and lower than the second EIRP.

A3. The method of embodiment A1 or A2, wherein a fractional bandwidth value associated with the operating frequency band is larger than a threshold based on the width of supported frequency bands.

A4. The method of embodiment A3, wherein the threshold is 6%.

A5. The method of any one of embodiments A1-A4, wherein the first frequency is a lowest supported frequency of the operating frequency band, the second frequency is a highest supported frequency of the operating frequency band, and the third frequency is a middle frequency of the operating frequency band.

A6. The method of any one of embodiments A1-A5, further comprising: declaring one or more additional EIRPs for one or more additional frequencies of the operating frequency band, wherein the one or more additional frequencies are between the first frequency and the second frequency.

B1. A method of determining Equivalent Isotropically Radiated Power (EIRP) for an operating frequency band of a base station, the method comprising: determining a first EIRP for a first frequency of the operating frequency band; determining a second EIRP for a second frequency of the operating frequency band; and determining a third EIRP for a third frequency of the operating frequency band, wherein the third frequency is between the first frequency and the second frequency, and the second frequency is higher than the first frequency.

B2. The method of embodiment B1, further comprising: declaring that, for a first frequency range between the first frequency and the third frequency, EIRP is higher than the first EIRP and lower than the third EIRP; and declaring that, for a second frequency range between the third frequency and the second frequency, EIRP is higher than the third EIRP and lower than the second EIRP.

B3. The method of embodiment B1 or B2, the method comprising: obtaining a fractional bandwidth value associated with the operating frequency band; and determining whether the obtained fractional bandwidth value is larger than a threshold based on the width of supported frequency bands.

B4. The method of embodiment B3, wherein the threshold is 6%.

B5. The method of any one of embodiments B1-B4, wherein determining the first EIRP, second EIRP, and third EIRP comprises calculating an equation given by: EIRP=TRP+D, where TRP represents total radiated power of the base station in dBm, and D represents directivity of the base station in dBi.

B6. The method of embodiment B5, wherein $D=D_E+10 \log(N)$, where $$D_E = 10\log\left(\frac{4\pi A_{eff}}{\lambda^2}\right),$$

where $A_{eff}$ represents antenna aperture in squared meters and $\lambda$ represents wavelength in meters.

B7. The method of any one of embodiments B1-B6, wherein the first frequency is a lowest supported frequency of the operating frequency band, the second frequency is a highest supported frequency of the operating frequency band, and the third frequency is a middle frequency of the operating frequency band.

B8. The any one of embodiments B1-B7, further comprising: determining one or more additional EIRPs for one or more additional frequencies of the operating frequency band, wherein the one or more additional frequencies are between the first frequency and the second frequency.

C1. A method for testing a device, the method comprising: obtaining the device; obtaining declared values associated with the device; and testing the device to determine whether the device is compliant with the obtained declared values.

C2. The method of embodiment C1, wherein the device operates in an operating frequency band, the declared values comprise a first Equivalent Isotropically Radiated Power (EIRP) for a first frequency of the operating frequency band, a second EIRP for a second frequency of the operating frequency band, and a third EIRP for a third frequency of the operating frequency band, the third frequency is between the first frequency and the second frequency, and the second frequency is higher than the first frequency.

C3. The method of embodiment C2, wherein the first frequency is a lowest supported frequency of the operating frequency band, the second frequency is a highest supported frequency of the operating frequency band, and the third frequency is a middle frequency of the operating frequency band.

While various embodiments of the present disclosure are described herein, it should be understood that they have been presented by way of example only, and not limitation. Thus, the breadth and scope of the present disclosure should not be limited by any of the above-described exemplary embodiments. Moreover, any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel.

The invention claimed is:

1. A method of determining Equivalent Isotropically Radiated Power (EIRP) for an operating frequency band of a base station, the method comprising:
   determining a first EIRP for a first frequency of the operating frequency band;
   determining a second EIRP for a second frequency of the operating frequency band; and
   determining a third EIRP for a third frequency of the operating frequency band, wherein
   the third frequency is between the first frequency and the second frequency, and
   the second frequency is higher than the first frequency
   wherein
   determining the first EIRP, second EIRP, and third EIRP comprises calculating an equation given by:

TRP+D, where TRP represents total radiated power of the base station in dBm, and D represents directivity of the base station in dBi.

2. The method of claim 1, further comprising:
   declaring that, for a first frequency range between the first frequency and the third frequency, EIRP is higher than the first EIRP and lower than the third EIRP; and
   declaring that, for a second frequency range between the third frequency and the second frequency, EIRP is higher than the third EIRP and lower than the second EIRP.

3. The method of claim 1, the method comprising:
   obtaining a fractional bandwidth value associated with the operating frequency band; and
   determining whether the obtained fractional bandwidth value is larger than a threshold based on the width of supported frequency bands.

4. The method of claim 3, wherein the threshold is further based on an EIRP accuracy window.

5. The method of claim 1, wherein $D=D_E+10 \log(N)$, where $D_{E=10}\log(4\pi A_{eff})/\lambda^2)$, where $A_{eff}$ represents antenna aperture in squared meters and $\lambda$ represents wavelength in meters.

6. The method of claim 1, wherein the first frequency is a lowest supported frequency of the operating frequency band, the second frequency is a highest supported frequency of the operating frequency band, and the third frequency is a middle frequency of the operating frequency band.

7. The method of claim 1, further comprising:
  determining one or more additional EIRPs for one or more additional frequencies of the operating frequency band, wherein the one or more additional frequencies are between the first frequency and the second frequency.

* * * * *